United States Patent [19]

Owada et al.

[11] Patent Number: 5,060,045
[45] Date of Patent: Oct. 22, 1991

[54] SEMICONDUCTOR INTEGRATED CIRCUIT DEVICE AND METHOD OF MANUFACTURING THE SAME

[75] Inventors: Nobuo Owada; Hiroyuki Akimori, both of Ohme; Takahisa Nitta, Fuchuu; Tohru Kobayashi; Shunji Sasabe, both of Iruma; Mikinori Kawaji, Hino; Osamu Kasahara, Hinode, all of Japan

[73] Assignee: Hitachi, Ltd., Tokyo, Japan

[21] Appl. No.: 422,640

[22] Filed: Oct. 17, 1989

[30] Foreign Application Priority Data

Oct. 17, 1988 [JP] Japan .................. 63-261035

[51] Int. Cl.[5] .............................. H01L 27/10
[52] U.S. Cl. ........................ 357/45; 357/40; 357/68; 357/41; 357/71
[58] Field of Search ............. 357/40, 45, 68, 41, 357/71

[56] References Cited

U.S. PATENT DOCUMENTS

| 4,883,980 | 11/1989 | Morimoto et al. | 357/45 |
|---|---|---|---|
| 4,893,170 | 1/1990 | Tokuda et al. | 357/45 |
| 4,910,574 | 3/1990 | Aipperspach et al. | 357/45 |
| 4,924,290 | 5/1990 | Enkaku et al. | 357/45 |
| 4,949,149 | 8/1990 | Arraut et al. | 357/45 |
| 4,949,162 | 8/1990 | Tamaki et al. | 357/45 |

FOREIGN PATENT DOCUMENTS

| 58-91657 | 5/1983 | Japan | 357/45 |
|---|---|---|---|
| 59-79549 | 5/1984 | Japan | 357/45 M |
| 60-22337 | 2/1985 | Japan | 357/45 |
| 60-247943 | 12/1985 | Japan | 357/45 |
| 61-194739 | 8/1986 | Japan | 357/45 M |
| 61-232634 | 10/1986 | Japan | 357/45 M |

OTHER PUBLICATIONS

"VLSI Device Handbook", pp. 371-372, issued by Kabushiki Kaisha Science Forum on Nov. 28, 1983.

Primary Examiner—Andrew J. James
Assistant Examiner—Steven Loke
Attorney, Agent, or Firm—Antonelli, Terry, Stout & Kraus

[57] ABSTRACT

Disclosed is a semiconductor integrated circuit device adopting a gate array scheme, having a plurality of layers of wiring formed by a Design Automation system. The device according to the present invention includes a semiconductor substrate having basic cell forming regions, the basic cell forming regions being spaced from each other with wiring channel regions between adjacent basic cell forming regions. The wiring includes at least first-layer wiring lines arranged overlying the wiring channel regions; second-layer wiring lines overlying both the basic cell forming regions and the wiring channel regions; and third-layer wiring lines overlying both the basic cell forming regions and the wiring channel regions. The first-, second- and third-layer wiring lines respectively extend in first, second and third directions, the second direction being different from the first direction. The wiring pitches of the second-layer wiring lines and the third-layer wiring lines are set substantially equal to or smaller than the wiring pitch of th first-layer wiring lines. As a further aspect of the present invention, the ratio of wiring pitch of third-layer wiring lines to first-layer wiring lines can be 0.5, 1.0, 1.5 or 2.0. In addition, insulator films on which are formed the wiring lines are respectively subjected to flattening processes in order to flatten their upper surfaces, prior to providing the wiring lines thereon.

51 Claims, 6 Drawing Sheets

SEMICONDUCTOR INTEGRATED CIRCUIT DEVICE AND METHOD OF MANUFACTURING THE SAME

BACKGROUND OF THE INVENTION

The present invention relates to semiconductor integrated circuit devices, and more particularly to techniques which are effective when applied to a semiconductor integrated circuit device adopting a gate array scheme wherein a plurality of layers of wiring are formed by a DA (Design Automation) system.

A logic LSI (Large-Scale Integrated Circuit) which adopts the gate array scheme is formed by a semiconductor manufacturing process to be stated below:

First, a semiconductor substrate on which basic cells each bearing a basic design are regularly arrayed is prepared beforehand. Each of the basic cells is constructed of built-in basic elements, for example, bipolar transistors, resistors and capacitors.

Subsequently, connections are done on the basis of a logic design within the basic cells and among the basic cells (among logic circuits) arrayed on the surface of the semiconductor substrate, whereby a desired logic function is attained. The connections are effected by the use of a plurality of layers of aluminum signal wiring.

The logic LSI of this type adopting the gate array scheme has the feature that the period of time for the completion of a product can be shortened. Besides, it has the feature that another logic function can be attained merely by altering a connection pattern.

In the logic LSI, as the gate count increases more, the occupation area of the basic cells tends to become larger, and that of wiring regions (wiring channel regions) where the connections formed among the basic cells are arranged tends to become smaller. Therefore, a logic LSI under development is constructed of a four-layer wiring structure in which spaces between basic cells and on them are effectively used as wiring regions, though this technique is not known. The first layer of wiring, the second layer of wiring and the third layer of wiring are chiefly configured of signal wiring lines. The fourth layer of wiring is chiefly configured of signal wiring lines and power source wiring lines. The first layer of wiring is arranged as the signal wiring lines which connect logic circuits among the basic cells, and also as intracellular wiring lines which connect various semiconductor elements within each of the basic cells. The second layer of wiring and the third layer of wiring are respectively arranged as the signal wiring lines which connect the logic circuits.

The connection pattern of the logic LSI under development is formed by a DA (Design Automation) system of two-dimensional processing which utilizes a computer. The DA system can automatically allocate the information items of the logic circuits subjected to logic designs, and it can also automatically allocate connection information (wiring information) items for connecting the logic circuits, into an X-Y latticed wiring channel region which is imaginarily set in a memory space. In the DA system, the wiring information items of the first layer of wiring and those of the third layer of wiring are allocated in the X-direction of the X-Y latticed wiring channel region. The wiring information items of the second layer of wiring are allocated in the Y-direction of the X-Y latticed wiring channel region. The connections between the first layer of wiring and the second layer of wiring and those between the second layer of wiring and the third layer of wiring are respectively done at the predetermined lattice points of the X-Y latticed wiring channel region.

When the wiring information items are automatically allocated by the DA system, a semiconductor manufacturing mask is produced on the basis of these wiring information items. The semiconductor manufacturing mask has the pattern of the connections which are to be formed in the logic LSI. A semiconductor wafer process is performed using the semiconductor manufacturing mask, whereby the logic LSI of the multilayer wiring structure described above can be manufactured.

By the way, the logic LSI which adopts the gate array scheme is stated in, for example, "VLSI DEVICE HANDBOOK", pp. 371-372, issued by Kabushiki Kaisha Science Forum on Nov. 28, 1983.

SUMMARY OF THE INVENTION

It has been found out by the inventors that the multilayer wiring structure of the logic LSI adopting the gate array scheme as stated above poses the following problems.

In the multilayer wiring structure, the shape of a step in a lower layer of wiring, for example, the first layer of wiring, is reflected on the upper surface of an inter-layer insulator film which is formed on the wiring layer, and the stepped shape appears on the upper surface of the inter-layer insulator film. The stepped shape of the upper surface of the inter-layer insulator film grows to be even greater in the inter-layer insulator film of an upper layer. For coping with such a phenomenon, it is required in the semiconductor wafer process that the widthwise dimension of each wiring line, the space between the adjacent wiring lines, etc. be increased in the upper layer so as to ensure a larger processing margin. That is, the pitches of the wiring lines (that is, the distance between the center lines of adjacent wiring lines, in the same layer of wiring) are made larger in the second layer of wiring than in the first layer of wiring, and larger in the third layer of wiring than in the second layer of wiring. In consequence, especially the third-layer wiring lines which are the signal wiring lines of the uppermost layer are small in number, and the number of the signal wiring lines which extend in the X-direction is insufficient. Therefore, the versatility of wiring is degraded, and the packaging rate of the logic circuits (the proportion of the number of packaged circuits to the number of packageable circuits) is lowered.

Moreover, since the signal wiring lines of the first layer of wiring and of the third layer of wiring extend in the X-direction, the number of the second-layer wiring lines, namely, the signal wiring lines extending in the Y-direction, is insufficient. Therefore, the packaging rate of the logic circuits is further decreased, similarly to the above.

The Official Gazette of Japanese Patent Application Laid-open No. 22337/1985 discloses a semiconductor integrated circuit device which adopts a gate array scheme employing a three-layer wiring structure. Since, however, the wiring lines of each layer are arranged in only the wiring regions between basic cells, a sharp increase in the number of signal wiring lines cannot be expected.

Moreover, with the semiconductor integrated circuit device adopting the gate array scheme, the occupation area of the wiring regions between the basic cells decreases with increase in the gate count, so that a sharp increase in the number of signal wiring lines cannot be expected in this regard, either.

Accordingly, it is an object of the present invention to provide, in a semiconductor integrated circuit device adopting a gate array scheme, a method, and device, capable of enhancing the packaging rate of circuits.

Another object of the present invention is to provide, in the semiconductor integrated circuit device specified above, a method, and device, capable of increasing the arrangement number of signal wiring lines which extend in an X-direction, thereby to accomplish the first-mentioned object.

Another object of the present invention is to provide, in the semiconductor integrated circuit device specified above, a method, and device, capable of increasing the arrangement number of signal wiring lines which extend in a Y-direction, thereby to accomplish the first-mentioned object.

Another object of the present invention is to provide, in the semiconductor integrated circuit device specified above, a method, and device, capable of accomplishing the first-mentioned object and simultaneously decreasing the period of time for the completion of the produced semiconductor integrated circuit device.

The aforementioned and other objects and novel features of the present invention will become apparent from the description of this specification when read in conjunction with the accompanying drawings.

Typical illustrative aspects of the present invention are briefly summarized as follows. As can be appreciated, these are exemplary and not limiting of the present invention.

(1) In a semiconductor integrated circuit device which adopts a gate array scheme, first-layer wiring lines are arranged among basic cells on a substrate, and also third-layer wiring lines are arranged among the basic cells and on the basic cells, on the basis of wiring information items allocated in the X-direction of the X-Y latticed wiring channel region of a DA (Design Automation) system; second-layer wiring lines are arranged among the basic cells and on the basic cells, on the basis of wiring information items allocated in the Y-direction of the X-Y latticed wiring channel region; and the pitch of the third-layer wiring lines is made substantially equal to or smaller than the pitch of the first-layer wiring lines.

(2) In a semiconductor integrated circuit device which adopts a gate array scheme, first-layer wiring lines are arranged among basic cells on a substrate, and also third-layer wiring lines are arranged among the basic cells and on the basic cells on the basis of wiring information items allocated in the X-direction of the X-Y latticed wiring channel region of a DA system; second-layer wiring lines are arranged among the basic cells and on the basic cells on the basis of wiring information items allocated in the Y-direction of the X-Y latticed wiring channel region; and the pitch of the second-layer wiring lines is made substantially equal to or smaller than the pitch of the first-layer wiring lines.

(3) In a semiconductor integrated circuit device which adopts a gate array scheme, first-layer wiring lines are arranged among basic cells on a substrate, and also third-layer wiring lines are arranged among the basic cells and on the basic cells on the basis of wiring information items allocated in the X-direction of the X-Y latticed wiring channel region of a DA system; second-layer wiring lines are arranged among the basic cells and on the basic cells on the basis of wiring information items allocated in the Y-direction of the X-Y latticed wiring channel region; and each of the pitches of the second-layer wiring lines and the third-layer wiring lines is made substantially equal to the pitch of the first-layer wiring lines.

According to the above expedient (1), spaces among the basic cells and on the basic cells are utilized, whereby the arrangement number of signal wiring lines extending in the X-direction can be increased by the third-layer wiring lines, and the arrangement number of signal wiring lines extending in the Y-direction can be increased by the second-layer wiring lines so that the versatility of the arrangement of wiring lines in the DA system can be increased, while the packaging rate of logic circuits can be enhanced; and, besides, the arrangement number of the third-layer wiring lines can be increased, and the arrangement numbers of the first-layer wiring lines as well as the third-layer wiring lines and the second-layer wiring lines can be equalized, so that the versatility of the arrangement of the wiring lines in the DA system can be increased still more, while the packaging rate of the logic circuits can be enhanced still more.

According to the above expedient (2), spaces among the basic cells and on the basic cells are utilized, whereby the arrangement number of signal wiring lines extending in the X-direction can be increased by the third-layer wiring lines, and the arrangement number of signal wiring lines extending in the Y-direction can be increased by the second-layer wiring lines, so that the versatility of the arrangement of wiring lines in the DA system can be increased, while the packaging rate of logic circuits can be enhanced; and, besides, the arrangement number of the second-layer wiring lines can be increased, and the arrangement number of the first-layer wiring lines as well as the third-layer wiring lines and the second-layer wiring lines can be equalized, so that the versatility of the arrangement of the wiring lines in the DA system can be increased still more, while the packaging rate of the logic circuits can be enhanced still more. Moreover, in the case where the respective pitches of the first-layer wiring lines and the second-layer wiring lines are substantially equal, the first-layer wiring lines and the second-layer wiring lines can be connected at any lattice point of the X-Y latticed wiring channel region, so that the versatility of the arrangement of the wiring lines in the DA system can be increased, while the packaging rate of the logic circuits can be enhanced.

According to the above expedient (3), the effects of the foregoing expedients (1) and (2) can be achieved; and, besides, neither "lessen" processing (a treatment for making the wiring lines finer) nor "broaden" processing (a treatment for making the wiring lines wider) is performed for the respective wiring information items of the first-layer wiring lines, second-layer wiring lines and third-layer wiring lines applied as inputs to the X-Y latticed wiring channel region of the DA system, so that the period of time for arithmetic processing in the DA system and the period of time for the completion of a product can be shortened in correspondence with the steps of such processing.

DESCRIPTION OF THE PREFERRED EMBODIMENTS

Throughout the drawings for illustrating embodiments, the same symbols are assigned to elements having the same functions, which shall not be repeatedly explained.

Figure 2:
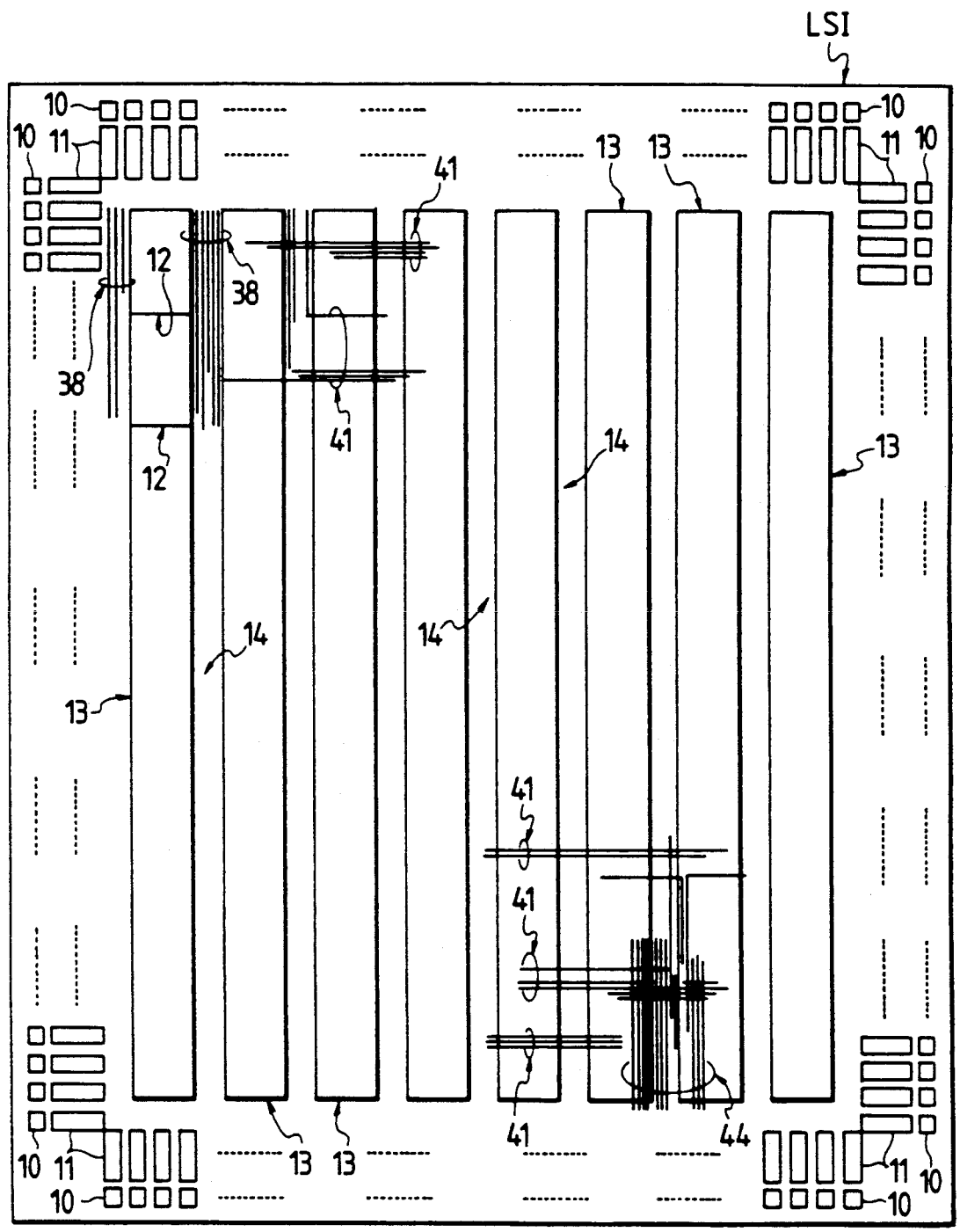
FIG. 2 is a chip layout diagram of the logic LSI.

The schematic construction of a semiconductor integrated circuit device (e.g., a logic LSI) adopting a gate array scheme, which is one embodiment of the present invention, is shown in FIG. 2 (a chip layout diagram).

As shown in FIG. 2, the logic LSI (denoted by symbol LSI) is constructed of a semiconductor chip (semiconductor pellet) which is rectangular in plan.

A plurality of external terminals (bonding pads) 10 are arrayed at the outer perimeter of the logic LSI along the sides of the rectangle thereof. The external terminals 10 are formed so as to electrically connect the logic LSI with external devices. At the peripheral edges of the logic LSI, a plurality of input/output buffer circuits 11 are arranged inside the external terminals 10. The input/output buffer circuits 11 are arranged at positions corresponding to the arrangement of the external terminals 10.

The logic LSI is provided with a logic circuit portion within a domain which is surrounded with the input/output buffer circuits 11. The logic circuit portion is such that a plurality of basic cells 12 each bearing a basic design are arranged regularly in the shape of a matrix. The basic cells 12 are arranged in a plural number in a row direction (X direction) as viewed in FIG. 2, whereby a basic cell array 13 is formed. A plurality of such basic cell arrays 13 are arranged in a column direction (Y direction) with wiring regions (wiring channel regions) 14 interposed between the respectively adjacent basic cell arrays 13.

Each of the basic cells 12 has built-in basic elements (transistors, resistors, capacitors, etc.) which number, for example, about 100–200. The basic cell 12 is adapted to construct predetermined logic circuits.

Each of the transistors arrayed in the basic cell 12 is a bipolar transistor which adopts a SEPT (Selective Etching of Poly-silicon Technology) structure. The bipolar transistor adopting the SEPT structure is such that, as will be described later, a base lead-out electrode, an emitter region, an emitter lead-out electrode, and an inter-layer insulator film to lie between the base lead-out electrode and the emitter lead-out electrode are respectively formed in self-alignment with a base region. Since the bipolar transistor adopting the SEPT structure can reduce the area of its operating regions and lower parasitic capacitances to be formed between the operating regions, it has a feature that the operating speed thereof can be increased.

The logic LSI adopts a four-layer wiring structure (multilayer wiring structure). In the four-layer wiring structure, at least a signal wiring has its connection pattern laid out by a DA (Design Automation) system which uses a computer. The semiconductor elements in each of the basic cells 12 of the logic LSI are chiefly connected by first-layer signal wiring lines (38A) (wiring lines within the basic cell). As shown in FIG. 2, first-layer signal wiring lines 38 are arranged in each of the wiring regions 14 held between the respectively adjacent basic cell arrays 13. With increase in the gate count, the size of the basic cell 12 enlarges, and the occupation area thereof is larger, so that the size (especially the widthwise dimension in the Y direction) of the wiring region 14 is smaller contrariwise. Concretely, the widthwise dimension in the Y direction of the wiring regions 14 is made, at most, about ¼ of that of the basic cells 12.

The first-layer signal wiring lines 38 in a plural number are arranged at a predetermined wiring pitch in the Y direction within each wiring region 14, and are extended in the X direction. These first-layer signal wiring lines 38 serve mainly to connect the logic circuits which are formed by subjecting the basic cells 12 to intracellular wiring.

By way of example, and not of limitation, the first-layer signal wiring lines 38 are formed under the conditions of a wiring width dimension of 3.0 $\mu$m, a wiring interval (the space between adjacent wiring lines) of 2.0 $\mu$m and a film thickness of 1.0 $\mu$m. Accordingly, the wiring pitch P1 of the first-layer signal wiring lines 38 is set at 5.0 $\mu$m. The wiring pitch P1 here signifies the dimension between the central position of one first-layer signal wiring line 38 in the wiring width direction thereof and that of another adjacent first-layer signal wiring line 38 in the same direction. Hereinbelow, this definition shall apply to wiring pitches.

A plurality of second-layer signal wiring lines 41 are formed on the basic cells 12 and on the wiring regions 14 (among the basic cells 12) so as to be arranged at a predetermined wiring pitch in the X direction and to be extended in the Y direction. That is, the second-layer signal wiring lines 41 extend with substantially the whole domain of the logic circuit portion of the logic LSI as their wiring region (wiring channel region). These second-layer signal wiring lines 41 serve mainly to connect the logic circuits. By way of example, the second-layer signal wiring lines 41 are formed under the conditions of a wiring width dimension of 3.5 $\mu$m, a wiring interval of 1.5 $\mu$m and a film thickness of 1.0 $\mu$m. The wiring pitch P2 of the second-layer signal wiring lines 41 is accordingly set at 5.0 $\mu$m.

A plurality of third-layer signal wiring lines 44 are formed on the basic cells 12 and on the wiring regions 14 (among the basic cells 12) so as to be arranged at a predetermined wiring pitch in the Y direction and to be extended in the X direction. Likewise to the second-layer signal wiring lines 41, the third-layer signal wiring lines 44 extend with substantially the whole domain of the logic circuit portion of the logic LSI as their wiring region. These third-layer signal wiring lines 44 serve mainly to connect the logic circuits. By way of example, the third-layer signal wiring lines 44 are formed under the conditions of a wiring width dimension of 3.5 $\mu$m, a wiring interval of 1.5 $\mu$m and a film thickness of 1.0 $\mu$m. The wiring pitch P3 of the third-layer signal wiring lines 44 is accordingly set at 5.0 $\mu$m.

Although not shown in FIG. 2, fourth-layer wiring lines (46) are arranged over the third-layer signal wiring lines 44. The fourth-layer wiring lines are mainly used as power source wiring lines and signal wiring lines. By way of example, the fourth-layer wiring lines are formed at a film thickness of 2.0 $\mu$m.

In this manner, the logic LSI of this embodiment is so constructed that, in the four-layer wiring structure, the first-layer signal wiring lines 38 and the third-layer signal wiring lines 44 are respectively extended in the identical X direction, while the second-layer signal wiring lines 41 are extended in the Y direction (the Y-direction being perpendicular to the X direction). Besides, the first-layer signal wiring lines 38, second-layer signal wiring lines 41 and third-layer signal wiring lines 44 are all formed at an equal wiring pitch.

Next, a practical structure of the logic LSI will be briefly described with reference to FIG. 1 (a sectional view).

Figure 1:
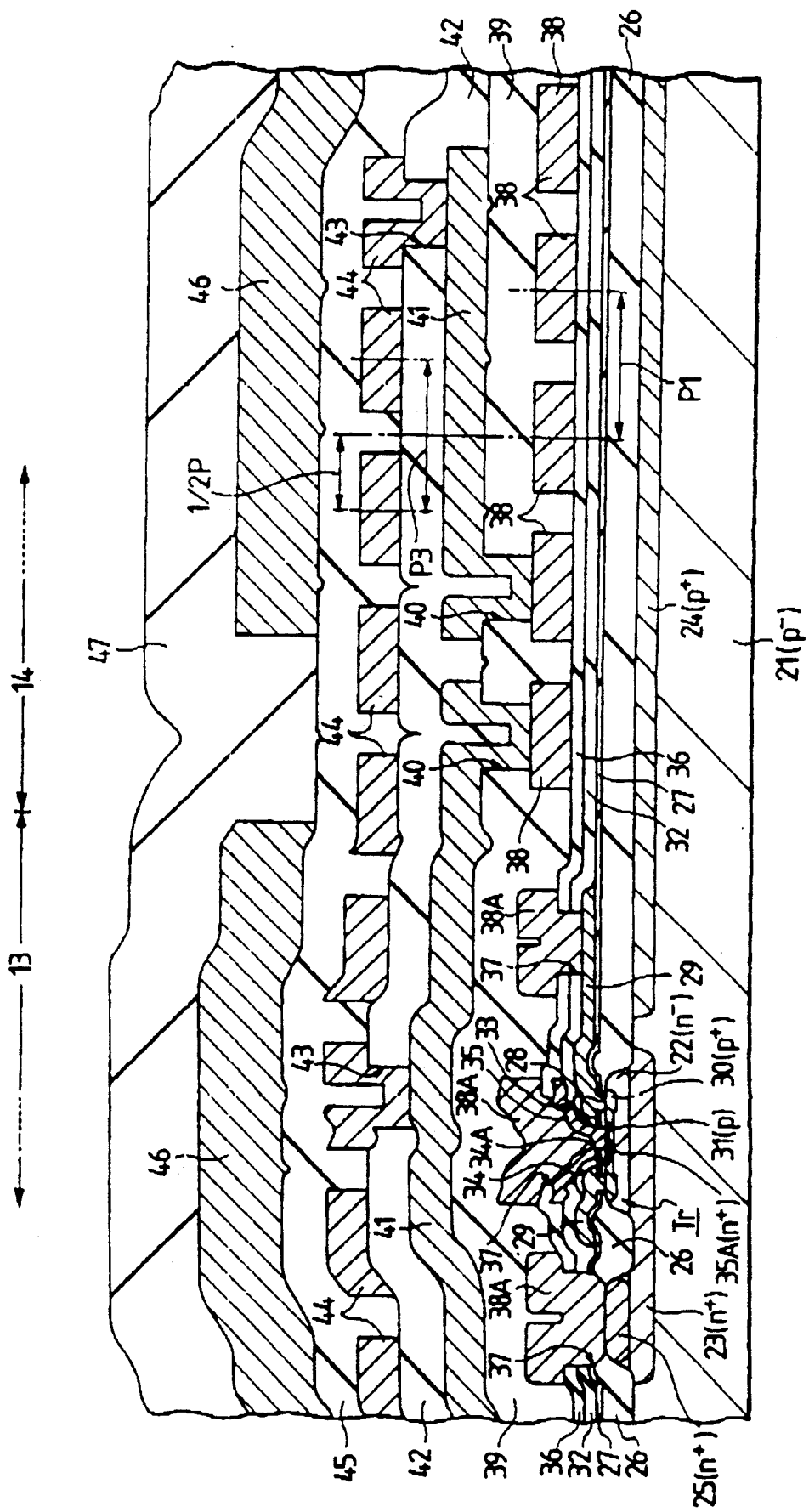
FIG. 1 is a sectional view of portions of a logic LSI adopting a gate array scheme which is an embodiment of the present invention.

As shown in FIG. 1, the logic LSI is constructed of a p$^-$-type semiconductor substrate 21 made of single-crystal silicon. The left side of FIG. 1 illustrates a portion of a basic cell 13, specifically a bipolar transistor Tr adopting the SEPT structure as constitutes the basic cell 13. The right side of FIG. 1 illustrates a portion of a wiring region 14, specifically the wiring layers of a multilayer wiring structure.

As seen from FIG. 1, the bipolar transistor Tr adopting the SEPT structure is electrically isolated from the other regions by an element isolation region. The element isolation region is configured of the semiconductor substrate 21, an element isolating insulator film 26 and a p+-type semiconductor region 24. The element isolating insulator film 26 is made of a silicon oxide film which is formed by locally oxidizing the principal surface of an n$^-$-type epitaxial layer 22. The element isolating insulator film 26 is so formed that the bottom surface thereof reaches the principal surface of the semiconductor substrate 21. The p+-type semiconductor region 24 is provided at the bottom of the element isolating insulator film 26 in the principal surface part of the semiconductor substrate 21. This p+-type semiconductor region 24 is formed as a channel stopper region.

The bipolar transistor Tr adopting the SEPT structure is constructed of a vertical type n-p-n structure which is configured of an n-type collector region, a p-type base region and an n-type emitter region.

The n-type collector region is constituted by a buried n+-type semiconductor region 23, an n+-type semiconductor region 25 for connecting a collector potential, and the epitaxial layer 22. In the n-type collector region, the collector potential connecting n+-type semiconductor region 25 has a first-layer signal wiring line (an intracellular wiring line) 38A connected thereto. The connection between the collector potential connecting n+-type semiconductor region 25 and the first-layer signal wiring line 38A is done through a contact hole 37 which is formed in inter-layer insulator films 27, 32 and 36. By way of example, the first-layer signal wiring line 38A is formed of an aluminum film or an aluminum alloy film which is deposited by sputtering or evaporation. The aluminum alloy film is doped with Cu or with Cu and Si. The dopant Cu functions chiefly to reduce migration. The dopant Si functions to reduce alloy spikes.

The p-type base region is constituted by a p+-type semiconductor region 30 which is a graft base region, and a p-type semiconductor region 31 which is an intrinsic base region. Both the p-type semiconductor region 31 and the p+-type semiconductor region 30 are formed in the principal surface part of the epitaxial layer 22.

In the p-type base region, the p+-type semiconductor region 30 being the graft base region has one end part of a base lead-out electrode 29 connected thereto through a base opening 28. By way of example, the base lead-out electrode 29 is formed of a polycrystalline silicon film at a first layer in the manufacturing process of the logic LSI, in which a p-type impurity (B) is introduced. This base lead-out electrode 29 is formed at a film thickness of, for example, 500–700 nm. One end side of the base lead-out electrode 29 (the side thereof defining an emitter opening 34A) has its position defined by the diffusion length of a p-type impurity from the p+-type semiconductor region 30, and it is formed in self-alignment with this p+-type semiconductor region 30. Although the planar geometry thereof is not shown, the base lead-out electrode 29 is so shaped that one end part thereof defines the periphery of the emitter opening 34A. The other end part of the base lead out electrode 29 has a first-layer signal wiring line (an intracellular wiring line) 38A connected thereto through a contact hole 37 which is formed in the inter-layer insulator films 32 and 36.

The n-type emitter region is formed of an n+-type semiconductor region 35A. The n+-type semiconductor region 35A is formed in the principal surface part of the p-type semiconductor region 31 which is the intrinsic base region. This n+-type semiconductor region 35A has an emitter lead-out electrode 35 connected thereto through the emitter opening 34A. By way of example, the emitter lead-out electrode 35 is formed of a polycrystalline silicon film at a second layer in the manufacturing process, in which an n-type impurity (As) is introduced. This emitter lead-out electrode 35 is formed at a film thickness of, for example, 200–300 nm. An inter-layer insulator film 34 is formed on the surface of one end side of the base lead-out electrode 29, and the emitter opening 34A is formed in a region defined by the inter-layer insulator film 34, within an opening 33 which is provided in the inter-layer insulator film 32. By way of example, the inter-layer insulator film 34 is made of a silicon oxide film obtained by oxidizing the surface of the base lead-out electrode 29, and it is formed in self-alignment with this base lead-out electrode 29. In consequence, the emitter lead-out electrode 35 is formed in self-alignment with the base lead-out electrode 29, and it is insulatedly isolated from the base lead-out electrode 29 through the inter-layer insulator film 34 in self-alignment fashion. The n+-type semiconductor region 35A being the n-type emitter region is formed in such a way that the n-type impurity introduced in the emitter lead-out electrode 35 is subjected to drive-in diffusion. The emitter lead-out electrode 35 has a first-layer signal wiring line (an intracellular wiring line) 38A connected thereto through a contact hole 37 which is formed in the inter-layer insulator film 36.

Incidentally, although the above-stated bipolar transistor Tr adopting the SEPT structure shall not be explained more as to the method of the formation thereof, it is formed by substantially the same method as a method of formation described in detail in, for example, the specification of U.S. patent application Ser. No. 201,928, filed on June 3, 1988, the contents of which are incorporated herein by reference.

Figure 3:
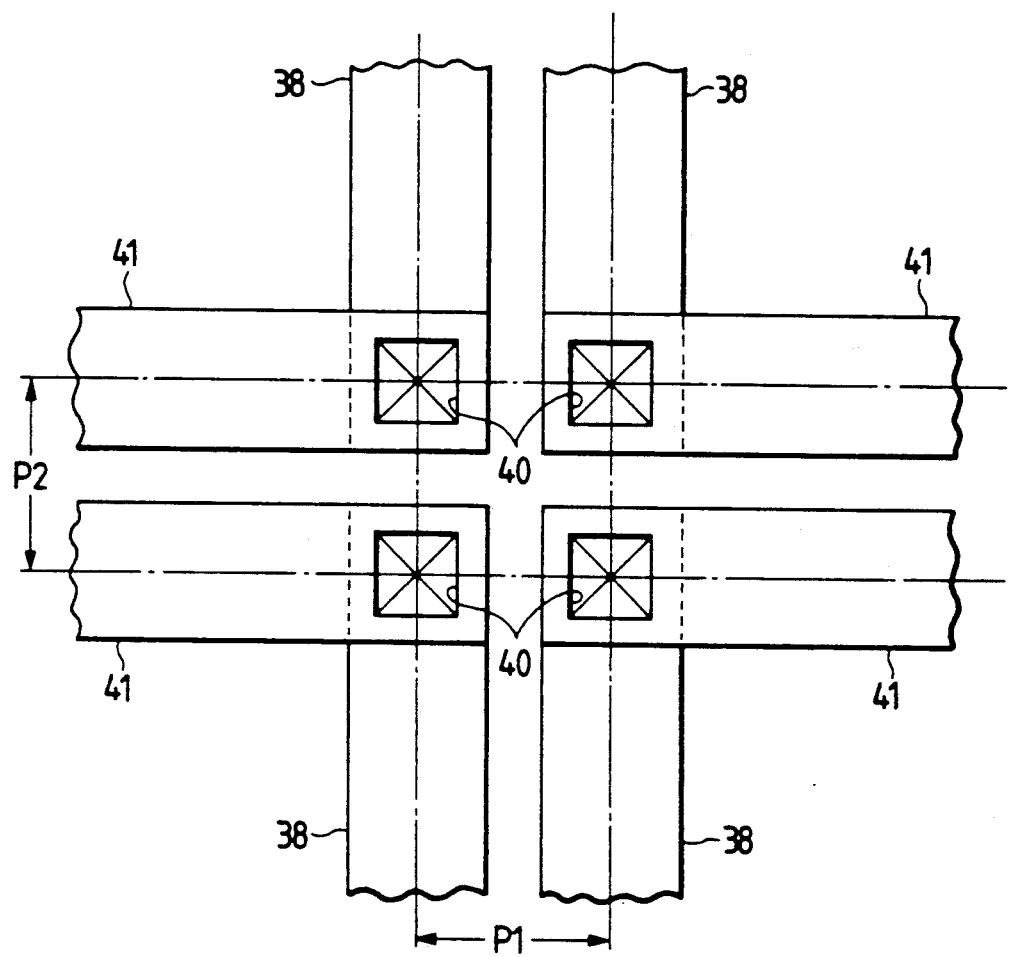
FIG. 3 is a plan view of portions of the logic LSI.

As shown in FIG. 1, first-layer signal wiring lines 38 are arranged on the upper surface of the inter-layer insulator film 36 in the wiring region 14. The first-layer signal wiring lines 38 are extended at a wiring pitch P1 in an X direction as illustrated in FIG. 1 and FIG. 3 (a plan view). These first-layer signal wiring lines 38 are formed from the same conductor layer (the same manufacturing step) as that of the foregoing first-layer signal wiring lines (intracellular wiring lines) 38A.

The first-layer signal wiring lines 38 are overlaid with second-layer signal wiring lines 41 through an inter-layer insulator film 39 as illustrated in FIGS. 1 and 3. The second-layer signal wiring lines 41 are extended at a wiring pitch P2 in a Y direction as described before. These second-layer signal wiring lines 41 are formed of a conductor film similar to that of the first-layer signal wiring lines 38.

In order to flatten the upper surface thereof, the inter-layer insulator film 39 is formed of, for example, a silicon oxide film which is deposited by CVD (Chemical Vapor Deposition) and whose upper surface is thereafter subjected to sputter etching with an inert gas, such as Ar gas, as is known in the art. By way of example, the silicon oxide film is deposited to a thickness of about 4 μm, and its upper surface is thereafter sputter-etched to a thickness of about 2.5 μm. The inter-layer insulator film 39 is so shaped that it has a thickness of about 1.0–1.5 μm at its flat part overlying each first-layer signal wiring line 38, and that a step (indent) from the upper surface is made 0.2–0.3 μm or less to recessed parts lying between adjacent first-layer signal wiring lines 38. That is, the inter-layer insulator film 39 is flattened so that its step or level difference may become about 20% or less. Besides, it is flattened so that the angle of an inclination part lying between the flat part and the recessed part (the angle of the slope of the stepped part) may become about 30° or less.

The inter-layer insulator film 39 may well be formed of a silicon oxide film which is deposited by bias sputtering (a known deposition process in which the deposition of a film and the etching of the surface of the deposited film are simultaneously carried out). Alternatively, it may well be formed of a composite film (a three-layer structure) which is produced in such a way that the upper surface of a silicon oxide film or a silicon nitride film deposited by plasma CVD is coated with a silicon oxide film by an SOG (Spin On Glass) method, and that a silicon oxide film deposited by plasma CVD is stacked on the upper surface of the coating film provided by the SOG method. The respective layers of the composite film, as viewed from the lowermost layer, have thicknesses of, for example, about 0.5 μm, about 0.2 μm and about 1.0 μm.

The second-layer signal wiring lines 41 are connected to the first-layer signal wiring lines 38 through contact holes 40 which are formed in the inter-layer insulator film 39. As shown in FIG. 3, the contact holes 40 are provided in the intersection parts between the first-layer signal wiring lines 38 and the second-layer signal wiring lines 41 (at positions which correspond to the lattice points of the X-Y latticed wiring channel region of the DA system). Although not restricted thereto, each of the contact holes 40 is formed by anisotropic etching, such as RIE (Reactive Ion Etching), and has a square shape of very small opening size, for example, 2.0 μm×2.0 μm as viewed in plan. Before the film of the second-layer signal wiring lines 41 is deposited, the surfaces of the first-layer signal wiring lines 38 exposed from within the contact holes 40 are subjected to a step of sputter etching in an inert gas atmosphere. The sputter etching step is carried out for the purpose of eliminating any insulating substance (for example, aluminum oxide) formed on the surfaces of the first-layer signal wiring lines 38 during the manufacturing process. At the sputter etching step, the side wall of the inter-layer insulator film 39 within each contact hole 40 might be bombarded with charged particles thereby to redeposit the insulator on the surface of the first-layer signal wiring line 38. In order to avoid the redeposition, the peripheral wall of the contact hole 40 should preferably be formed abrupt, for example, substantially perpendicular, with respect to the surface of the first-layer signal wiring line 38. In a case where the step coverage of the second-layer signal wiring line 41 degrades due to the abrupt stepped shape of the peripheral wall of the contact hole 40, the contact hole 40 should preferably be filled up with an electrically conductive material. As the conductive material for filling up the contact holes 40, there is used, for example, tungsten (W) which is obtained in such a way that a layer of the material is deposited by CVD and is etched so as to leave this material in only the contact holes 40, as known in the art. Alternatively, the contact holes 40 may well be filled up with tungsten which is locally deposited by selective CVD, as known in the art.

The second-layer signal wiring lines 41 ar overlaid with third-layer signal wiring lines 44 through an inter-layer insulator film 42. The third-layer signal wiring lines 44 are extended at a wiring pitch P3 in the X direction as described before. The wiring pitch P3 of the third-layer signal wiring lines 44 is set substantially the same as the wiring pitch P1 of the first-layer signal wiring lines 38. As illustrated in FIG. 1, the central position of the third-layer signal wiring line 44 in the widthwise direction thereof is shifted in correspondence with an amount of the wiring pitch P1 or P3 in the Y direction as compared with the central position of the first-layer signal wiring line 38 in the widthwise direction thereof. The reason why the wiring lines 38 and 44 are shifted is as follows: In the X-Y latticed wiring channel region which is imaginarily set in the two-dimensional memory space of the DA system, the first-layer signal wiring lines (ALI) and the third-layer signal wiring lines (ALIII) extending in the identical X direction need to be respectively distinguished as to the layers to which they belong. The third-layer signal wiring lines 44 are formed of a conductor film which is similar to that of the first-layer signal wiring lines 38. The inter-layer insulator film 42 is formed of an insulator film which is similar to that of the inter-layer insulator film 39.

The third-layer signal wiring lines 44 are connected to the second-layer signal wiring lines 41 through contact holes 43 which are formed in the inter-layer insulator film 42. As shown in FIG. 1, the contact holes 43 are provided in the intersection parts between the second-layer signal wiring lines 41 and the third-layer signal wiring lines 44 (at positions which correspond to the lattice points of the X-Y latticed wiring channel region of the DA system as in the foregoing). Since the third-layer signal wiring lines 44 are shifted relative to the first-layer signal wiring lines 38, the contact holes 43 are shifted in correspondence with the amount of the shift relative to the contact holes 40. That is, the contact holes 43 are shifted in correspondence with the amount of ½ of the wiring pitch P1 or P3 in the Y direction relative to the contact holes 40. Likewise to the contact hole 40, the contact hole 43 is formed so as to have an opening size of, for example, 2.0 μm×2.0 μm.

The third-layer signal wiring lines 44 are overlaid with fourth-layer wiring lines 46 through an inter-layer insulator film 45. Although this situation is not shown in FIG. 1, the fourth-layer wiring lines 46 are connected to the third-layer signal wiring lines 44, etc. through contact holes which are formed in the inter-layer insulator film 45. These fourth-layer wiring lines 46 are made of a conductor film which is similar to that of the first-layer signal wiring lines 38. In addition, the inter-layer insulator film 45 is made of an insulator film which is similar to that of the inter-layer insulator film 39.

The fourth-layer wiring lines 46 are overlaid with a final passivation film 47. By way of example, the final passivation film 47 is formed of a silicon nitride film deposited by plasma CVD or sputtering.

In the multilayer wiring structure thus constructed, the upper surfaces of the inter-layer insulator films 36, 39 and 42, which serve as the respective substrate films of the first-layer signal wiring lines 38, second-layer signal wiring lines 41 and third-layer signal wiring lines 44 functioning as the main signal wiring lines, are subjected to the flattening steps as described before. On the basis of the steps of flattening the upper surface of the substrate films, the multilayer wiring structure of three or more layers can be arranged such that the first-layer signal wiring lines 38, second-layer signal wiring lines 41 and third-layer signal wiring lines 44 have dense wiring pitches, respectively. In addition, the multilayer wiring structure can be provided such that each of the respective wiring pitches P2 and P3 of the second-layer signal wiring lines 41 and third-layer signal wiring lines 44 of the upper layers is substantially equal to (or smaller than) the wiring pitch P1 of the first-layer signal wiring lines 38 of the lower layer.

The first-layer signal wiring lines 38 (including the intracellular wiring lines 38A), second-layer signal wiring lines 41, third-layer signal wiring lines 44, contact holes 40 and contact holes 43 stated before are respectively formed on the basis of the design automation system which employs a computer. A method of forming the logic LSI which adopts the gate array scheme will be briefly described with reference to FIG. 4 (a development flow diagram of the logic LSI).

Figure 4:
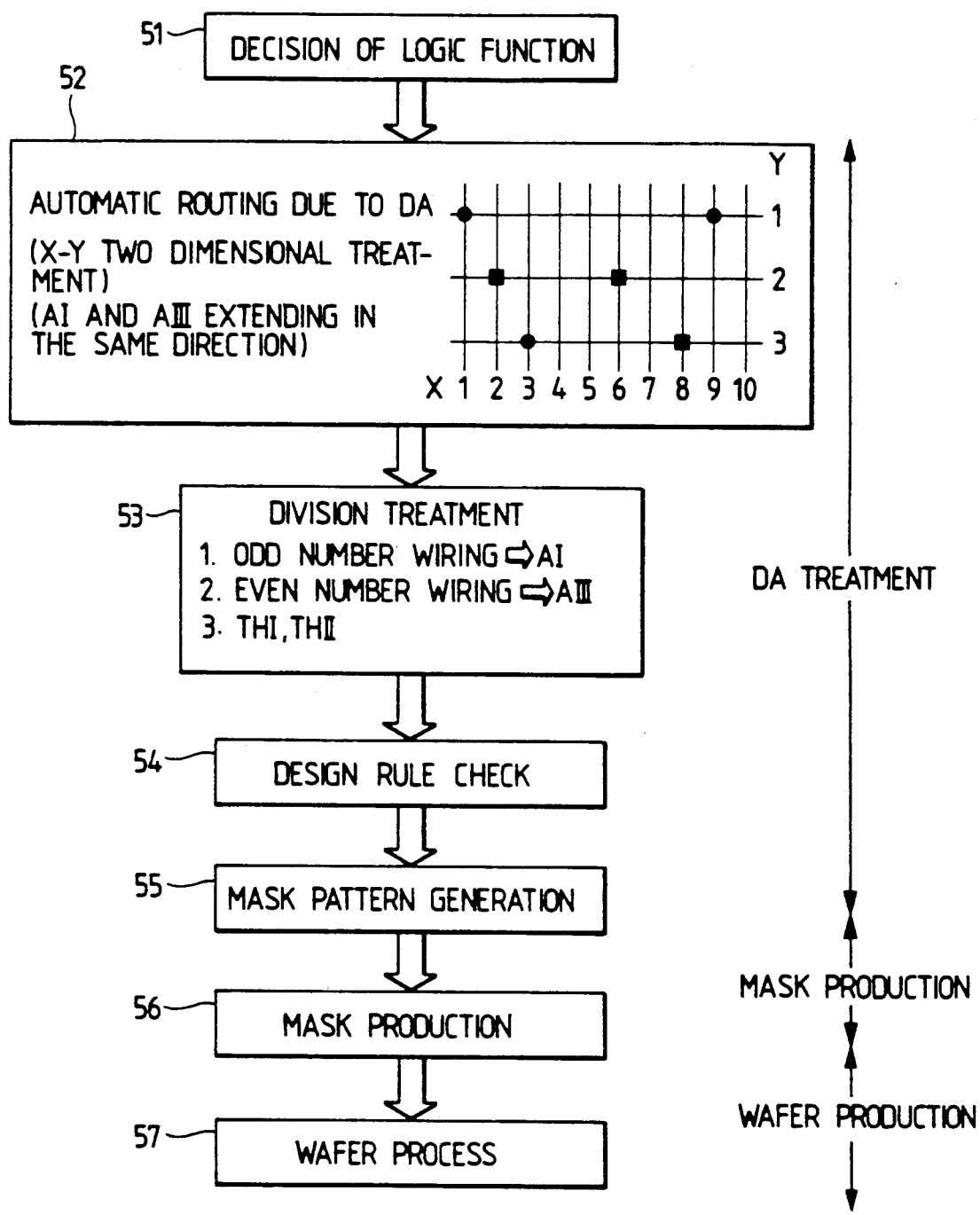
FIG. 4 is a flow diagram for explaining a method of developing the logic LSI.

First, a logic function to be included in the logic LSI is determined <step 51>, as shown in FIG. 4. More specifically, after a logic circuit to be built in the logic LSI is designed, the operation of the logic function is verified by performing the logic simulation of the logic circuit, and the logic function to be included is finally determined.

Subsequently, using the computerized design automation (DA) system of two-dimensional treatment, wiring information items (connection information items) and contact hole information items are automatically allocated <step 52> on the X-Y latticed wiring channel region of the DA system in accordance with the determined logic functions. Here, the allocation of signal wiring line information items (corresponding to the first-layer to third-layer signal wiring lines 38, 41 and 44) and contact hole information items for connecting these signal wiring lines (corresponding to the contact holes 40 and 43) will be described, and the allocation of intracellular wiring line information items (corresponding to the logic circuit or the first-layer signal wiring lines 38A) shall be omitted from the description. The X-Y latticed wiring channel region is configured of a plurality of wiring lines 1, 2, ... and 10 extending in an X direction as arrayed at a wiring pitch of predetermined interval, and a plurality of wiring lines 1, 2 and 3 extending in a Y direction as arrayed at a wiring pitch of predetermined interval. The wiring lines extending in the X direction correspond to ½ of the wiring pitch P1 of the first-layer signal wiring lines 38 or the wiring pitch P3 of the third-layer signal wiring lines 44 stated before. The wiring lines extending in the Y direction correspond to the wiring pitch P2 of the second-layer signal wiring lines 41. The X-Y latticed wiring channel region is imaginarily set in that memory space of the DA system in which memory cells are arrayed in two dimensions.

Subsequently, the wiring information items and the contact hole information items allocated in the X-Y latticed wiring channel region of the DA system are divided in three dimensions <step 53>. More specifically, the wiring information items allocated in the odd-numbered ones n (n=1, 3, 5, ...) of the wiring channel regions extending in the X direction, within the X-Y latticed wiring channel region, are used for the first-layer signal wiring lines AI. The wiring information items allocated in the even-numbered ones (n+1) of the wiring channel regions extending in the X direction are used for the third-layer signal wiring lines AIII. The wiring information items allocated in the wiring channel regions extending in the Y direction are used for the second-layer signal wiring lines AII. In addition, the contact hole information items allocated at the lattice points between the odd-numbered ones n of the X-directional wiring channel regions of the X-Y latticed wiring channel region and the Y-directional wiring channel regions are used for the contact holes THI which connect the first-layer signal wiring lines AI and the second-layer signal wiring lines AII. The contact hole information items allocated at the lattice points between the even-numbered ones (n+1) of the X-directional wiring channel regions and the Y-directional wiring channel regions are used for the contact holes THII which connect the second-layer signal wiring lines AII and the third-layer signal wiring lines AIII. That is, the first-layer signal wiring lines AI, second-layer signal wiring lines AIL, third-layer signal wiring lines AII, contact holes THI, and contact holes THII are respectively discriminated in the program of the DA system.

At the next step, the design rules of the connection layout formed by the automatic wiring treatment <step 52> are checked <step 54>. The design rule check is done chiefly for checking whether or not the signal wiring lines can be formed as per the connection layout without any problem in a semiconductor wafer process. In a case where the connection layout has been decided defective by the design rule check, it is partly corrected. When the design rule check <step 54> has been passed as a nondefective connection layout, a mask pattern is generated <step 55> on the basis of the aforementioned wiring information items and contact hole information items of the DA system. The processing steps after the determination of the logic function <step 51>, from the automatic wiring treatment <step 52> to the generation of the mask pattern <step 55>, constitute the DA treatment which uses the DA system.

At the next step, semiconductor manufacturing masks are produced <step 56>. The mask production is carried out using, for example, an electron-beam projection aligner on the basis of the wiring information items and the contact hole information items which have been automatically allocated by the DA system, as is known in the art. The semiconductor manufacturing mask is constructed of, for example, a quartz glass substrate whose surface has a pattern depicted thereon by a screening film of Cr, CrO or the like. The semiconductor manufacturing mask of the first-layer signal wiring lines 38 is formed on the basis of the information items of the first-layer signal wiring lines AI. Likewise, the semiconductor manufacturing masks of the second-layer signal wiring lines 41, third-layer signal wiring lines 44, contact holes 40 and contact holes 43 are respectively formed on the basis of the information items of the second-layer signal wiring lines AII, third-layer signal wiring lines AIII, contact holes THI and contact holes THII.

Next, the semiconductor wafer process (wafer production) is performed <step 57> using the semiconductor manufacturing masks mentioned above. More specifically, first of all, the first-layer signal wiring lines 38 are formed on the semiconductor wafer (unconnected) of the logic LSI with the basic cells 12 arrayed therein, as illustrated in FIGS. 1 and 3. Subsequently, the inter-layer insulator film 39, contact holes 40 and second-layer signal wiring lines 41 are respectively formed in succession. Subsequently, the inter-layer insulator film 42, contact holes 43 and third-layer signal wiring lines 44 are respectively formed in succession. Besides, the inter-layer insulator film 45, fourth-layer wiring lines 46 and final passivation film 47 are respectively formed in succession. Thus, the logic LSI having the predetermined logic function is finished up. The first-layer signal wiring lines 38, contact holes 40, second-layer signal wiring lines 41, contact holes 43, third-layer signal wiring lines 44, etc. are formed by photolithography known in the art. The photolithography includes forming etching masks of photoresist films (photosensitive resin films) by the use of the above-discussed semiconductor manufacturing masks, and etching the respective layers by the use of the etching masks.

In this manner, in a logic LSI which adopts the gate array scheme, first-layer signal wiring lines 38 are arranged among basic cells 12 on a semiconductor substrate 21 and also third-layer signal wiring lines 44 are arranged among the basic cells 12 and on them, on the basis of wiring information items allocated in the X direction of the X-Y latticed wiring channel region of a design automation (DA) system, while second-layer signal wiring lines 41 are arranged among the basic cells 12 and on them, on the basis of wiring information items allocated in the Y direction of the X-Y latticed wiring channel region, and the wiring pitch P3 of the third-layer signal wiring lines 44 is set substantially equal to the wiring pitch P1 of the first-layer signal wiring lines 38. Owing to this construction, the utilization of spaces among the basic cells 12 and on them makes it possible to increase the arrangement number of signal wiring lines extending in the X direction, by means of the third-layer signal wiring lines 44, and further to increase the arrangement number of the second-layer signal wiring lines 41 extending in the Y direction, so that the versatility of the arrangement of the signal wiring lines in the DA system can be enhanced to raise the packaging rate of logic circuits. It is also made possible to increase the arrangement number of the third-layer signal wiring lines 44, and to equalize the arrangement numbers of the first-layer signal wiring lines 38 as well as the third-layer signal wiring lines 44 and the second-layer signal wiring lines 41, so that the versatility of the arrangement of the signal wiring lines in the DA system can be more enhanced to raise the packaging rate of the logic circuits still more. Particularly in the logic LSI under development by the present inventors, as illustrated in FIG. 2, the occupation area of the basic cells 12 is large, whereas the occupation area of the wiring regions 14 is small, so that the arrangement number of the first-layer signal wiring lines 38 is small. Accordingly, the application of the present invention to this logic LSI is especially effective.

Besides, in a logic LSI which adopts the gate array scheme, first-layer signal wiring lines 38 are arranged among basic cells 12 on a semiconductor substrate 21 and also third-layer signal wiring lines 44 are arranged among the basic cells 12 and on them, on the basis of wiring information items allocated in the X direction of the X-Y latticed wiring channel region of a design automation (DA) system, while second-layer signal wiring lines 41 are arranged among the basic cells 12 and on them, on the basis of wiring information items allocated in the Y direction of the X-Y latticed wiring channel region, and the wiring pitch P2 of the second-layer signal wiring lines 41 is set substantially equal to the wiring pitch P1 of the first-layer signal wiring lines 38. Owing to this construction, the utilization of spaces among the basic cells 12 and on them makes it possible to increase the arrangement number of signal wiring lines extending in the X direction, by means of the third-layer signal wiring lines 44, and further to increase the arrangement number of the second-layer signal wiring lines 41 extending in the Y direction, so that the versatility of the arrangement of the signal wiring lines in the DA system can be enhanced to raise the packaging rate of logic circuits. It is also made possible to increase the arrangement number of the second-layer signal wiring lines 41, and to equalize the arrangement numbers of the first-layer signal wiring lines 38 as well as the third-layer signal wiring lines 44 and the second-layer signal wiring lines 41, so that the versatility of the arrangement of the signal wiring lines in the DA system can be more enhanced to raise the packaging rate of the logic circuits still more. Moreover, in the case where the respective wiring pitches P1 and P2 of the first-layer signal wiring lines 38 and second-layer signal wiring lines 41 are substantially equal, the connections between the first-layer signal wiring lines 38 and the second-layer signal wiring lines 41 can be done at any of the lattice points of the X-Y latticed wiring channel region as illustrated in FIG. 3, so that the versatility of the arrangement of the signal wiring lines in the DA system can be further enhanced to further raise the packaging rate of the logic circuits more. This effect holds true also in a case where the respective wiring pitches P2 and P3 of the second-layer signal wiring lines 41 and third-layer signal wiring lines 44 are substantially equal.

In addition, by setting the wiring pitch P3 of the third-layer signal wiring lines 44 to be smaller than the wiring pitch P1 of the first-layer signal wiring lines 38, the arrangement number of the third-layer signal wiring lines 44 can be further increased, so that the packaging rate of the logic circuits can be raised still more. The wiring pitch P3 of the third-layer signal wiring lines 44 should preferably be set at ½ (the 0.5 the wiring pitch) of the wiring pitch P1 of the first-layer signal wiring lines 38 in practical use.

Figure 5:
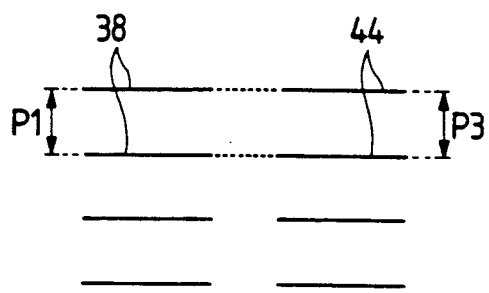
FIGS. 5 through 9 are model layout diagrams of the wiring lines of the logic LSI.
Figure 8:
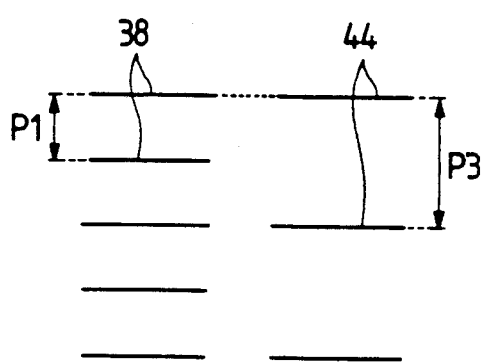
Figure 6:
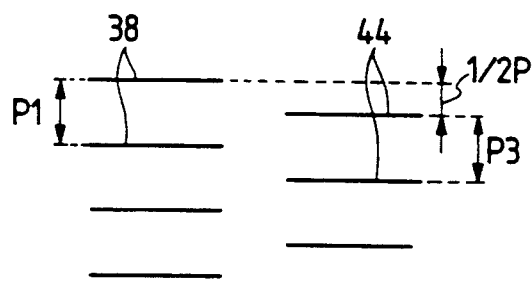
Figure 9:
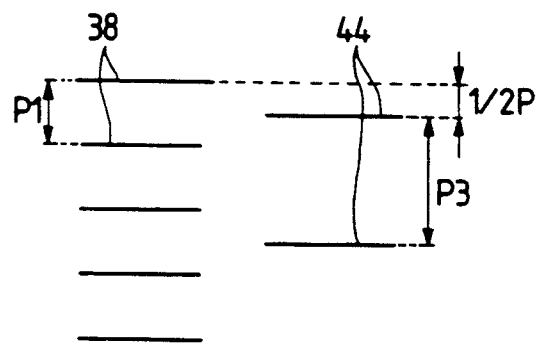
Figure 7:
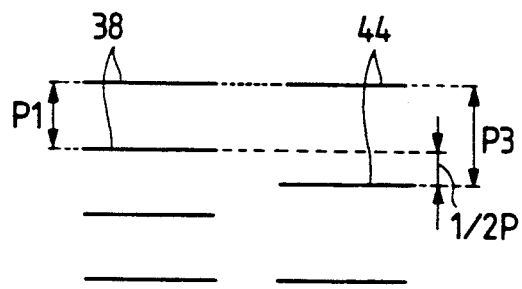
Figure 10:
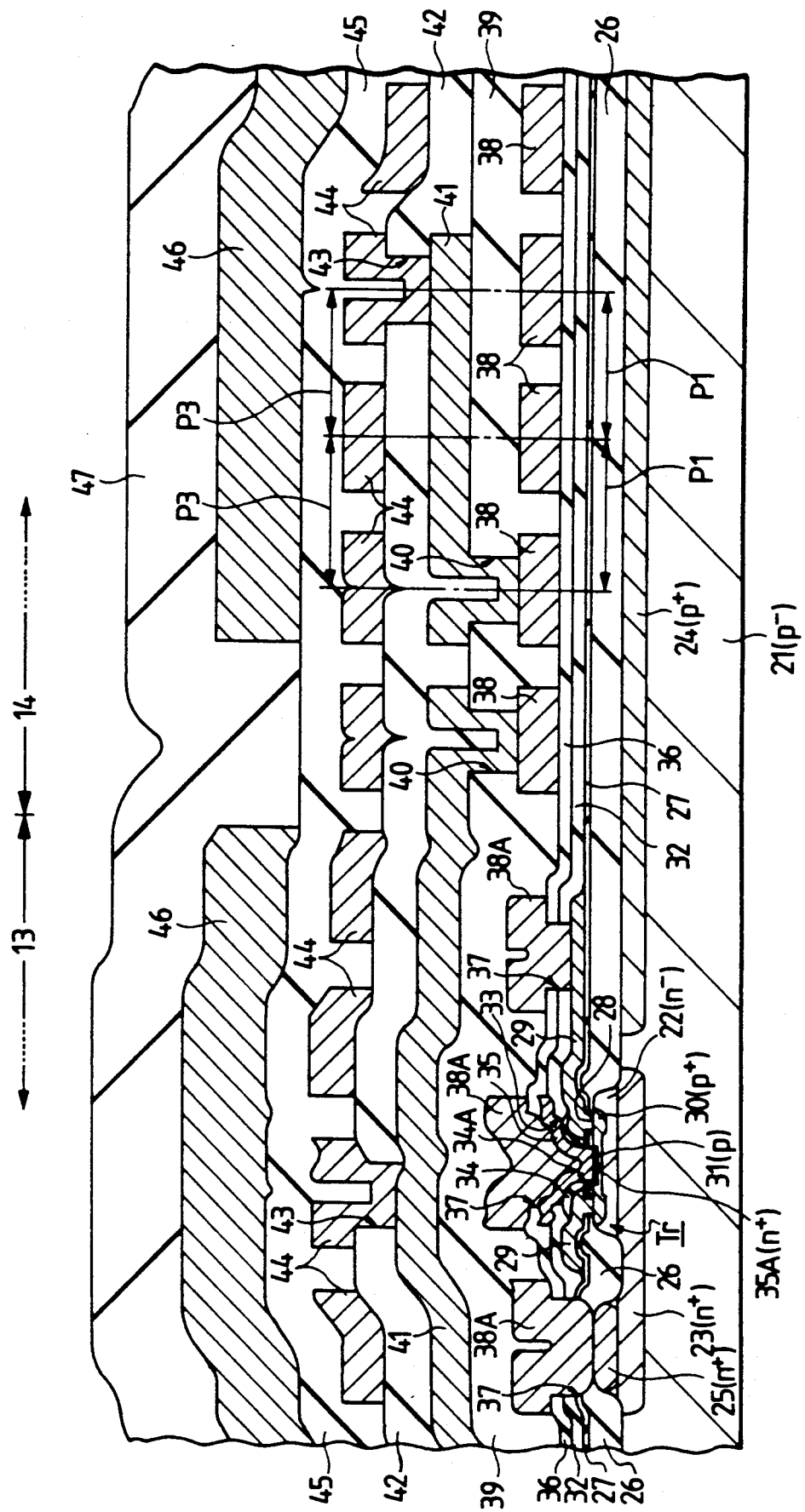
FIG. 10 is a sectional view of portions of a logic LSI adopting the gate array system in another embodiment of the present invention.

The wiring pitch P3 of the third-layer signal wiring lines 44 relative to the wiring pitch P1 of the first-layer signal wiring lines 38 is set within ranges illustrated in FIGS. 5 through 9 (model layout diagrams of the first-layer and third-layer signal wiring lines) in practical use. In FIGS. 5 through 9, the solid lines (e.g., lines 44, 44 in FIG. 5) show the central positions of adjacent wiring lines of the same layer (e.g., third layer). More specifically, the wiring pitch P3 of the third-layer signal wiring lines 44 shown in FIG. 5 is equalized to the wiring pitch P1 of the first-layer signal wiring lines 38. In addition, the central position of each third-layer signal wiring line 44 in the widthwise direction thereof is held substantially in agreement with the central position of the corresponding first-layer signal wiring line 38 in the widthwise direction thereof (these signal wiring lines exist on an identical center axis). The sectional structure of a logic LSI in which the wiring pitches shown in FIG. 5 are set, is depicted in FIG. 10 (a sectional view). The wiring pitch P3 of the third-layer signal wiring lines 44 shown in FIG. 6 is as explained in the foregoing embodiment, and is equal to the wiring pitch P1 of the first-layer signal wiring lines 38. Besides, the central position of each third-layer signal wiring line 44 in the widthwise direction thereof is shifted in an amount equal to ½ of the wiring pitch, with respect to the central position of a corresponding first-layer signal wiring line 38 in the widthwise direction thereof. The wiring pitch P3 of the third-layer signal wiring lines 44 shown in FIG. 7 has a ratio of 1.5 relative to the wiring pitch P1 of the first-layer signal wiring lines 38. Besides, the central position of every second third-layer signal wiring line 44 in the widthwise direction of each wiring line is held in agreement with the central position of the corresponding first-layer signal wiring line 38 in the widthwise direction of each wiring line. The wiring pitch P3 of the third-layer signal wiring lines 44 shown in FIG. 8 has a ratio of 2.0 relative to the wiring pitch P1 of the first-layer signal wiring lines 38. Besides, the central position of each third-layer signal wiring line 44 in the widthwise direction thereof is held in agreement with the central position of a corresponding first-layer signal wiring line 38 in the widthwise direction thereof. The wiring pitch P3 of the third-layer signal wiring lines 44 shown in FIG. 9 has a ratio of 2.0 relative to the wiring pitch P1 of the first-layer signal wiring lines 38. Besides, the central position of each third-layer signal wiring line 44 in the widthwise direction thereof is shifted in an amount equal to ½ of the wiring pitch of the first-layer signal wiring lines 38, with respect to the central position of the corresponding first-layer signal wiring line 38 in the widthwise direction thereof.

In this manner, in a method of forming a logic LSI which adopts the gate array scheme, the first-layer signal wiring lines 38 and third-layer signal wiring lines 44 of a multilayer wiring structure are extended in an X direction, while the second-layer signal wiring lines 41 are extended in a Y direction, and the ratio of the wiring pitch P3 of the third-layer signal wiring lines 44 to that of the first-layer signal wiring lines 38 is set at 0.5, 1.0, 1.5 or 2.0. Owing to this construction, in connecting the first-layer signal wiring lines 38 or third-layer signal wiring lines 44 and the second-layer signal wiring lines 41, they can be connected efficiently in a state in which a manufacturing process margin is secured, so that useless signal wiring lines can be decreased to raise the packaging rate of logic circuits.

In addition, by setting the wiring pitch P2 of the second-layer signal wiring lines 41 to be smaller than the wiring pitch P1 of the first-layer signal wiring lines 38, the arrangement number of the second-layer signal wiring lines 41 can be further increased, so that the packaging rate of the logic circuits can be increased still more. By way of example, the second-layer signal wiring lines 41 are laid at a wiring pitch P2 of approximately 4.5–4.8 μm. The wiring pitch P2 of the second-layer signal wiring lines 41 is set independently of each of the wiring pitches P1 of the first-layer signal wiring lines 38 and the wiring pitch P3 of the third-layer signal wiring lines 44, and moreover, the setting of the wiring pitch P2 can be done at will, so that this wiring pitch P2 is not restricted by the wiring pitch P1 of the first-layer signal wiring lines 38, unlike the wiring pitch P3 of the third-layer signal wiring lines 44. The wiring pitch P2 of the second-layer signal wiring lines 41 can be set by additionally performing a "lessen" treatment (a treatment for making a pattern finer) after the automatic wiring step <52> and before the mask production step <56> in the DA treatment illustrated in FIG. 4. To the contrary, the wiring pitch P2 of the second-layer signal wiring lines 41 may well be set at a small value beforehand, whereupon each of the wiring pitch P1 of the first-layer signal wiring lines 38 and the wiring pitch P3 of the third-layer signal wiring lines 44 is set large by a "broaden" treatment (a treatment for making a pattern wider) in the DA treatment.

Moreover, the arrangement number of the signal wiring lines extending in the X direction can be increased by the third-layer signal wiring lines 44 as stated before, so that the layout rules of the first-layer signal wiring lines 38 can be relieved to widen the manufacturing process margin of a semiconductor wafer and to enhance the available percentage of the logic LSI in production.

Besides, in a logic LSI which adopts the gate array scheme, first-layer signal wiring lines 38 are arranged among basic cells 12 and also third-layer signal wiring lines 44 are arranged among the basic cells 12 and on them, on the basis of wiring information items allocated in the X direction of the X-Y latticed wiring channel region of a design automation (DA) system, while second-layer signal wiring lines 41 are arranged among the basic cells 12 and on them, on the basis of wiring information items allocated in the Y direction of the X-Y latticed wiring channel region, and each of the wiring pitch P2 of the second-layer signal wiring lines 41 and the wiring pitch P3 of the third-layer signal wiring lines 44 is set substantially equal to the wiring pitch P1 of the first-layer signal wiring lines 38. Owing to this construction, the aforementioned effect of raising the packaging rate can be achieved, and simultaneously, the respective wiring information items of the first-layer signal wiring lines 38, second-layer signal wiring lines 41 and third-layer signal wiring lines 44 as have been input to the X-Y latticed wiring channel region of the DA system are subjected to neither a "lessen" treatment nor a "broaden" treatment, so that in correspondence with the steps of the treatments, a processing time (DA treatment time) in the DA system can be shortened to shorten a period of time for finishing up the product.

By the way, the present invention may well apply the logic LSI to a five-layer wiring structure consisting of four layers of signal wiring lines and one layer of power source wiring lines, or to a multilayer wiring structure consisting of more layers. According to the present invention, in the case of the five-layer wiring structure, first-layer signal wiring lines and third-layer signal wiring lines are extended in an X direction, while second-layer signal wiring lines and fourth-layer signal wiring lines are extended in a Y direction.

Although, in the above, the invention made by the inventor has been concretely described in conjunction with embodiments, it is a matter of course that the present invention is not restricted to the foregoing embodiments, but that it can be variously altered within a scope not departing from the purport thereof.

By way of example, the present invention is applicable to an electron device of a mother chip structure in which a plurality of semiconductor integrated circuit devices (semiconductor chips) are carried on the mounting surface of a wired circuit board of a multilayer wiring structure. The multilayer wiring structure of the wired circuit board of the electron device has at least three layers of signal wiring lines, which are automatically arranged by the use of a design automation system in the same manner as in the foregoing. The wired circuit board is formed of, for example, a single crystal silicon substrate, a silicon carbide substrate, a ceramic substrate, or a mullite substrate.

In addition, the present invention is not restricted to logic LSIs only, but it is applicable to memory LSIs and logic LSIs with memories, for example, microcomputers. Besides, according to the present invention, the basic cells of a logic LSI may well be configured mainly of complementary MISFETs or of the combination of bipolar transistors and complementary MISFETS.

Effects which are achieved by typical aspects of performance of the present invention are briefly described as follows:

(1) In a semiconductor integrated circuit device which adopts a gate array scheme, the packaging efficiency of circuits can be enhanced.

(2) In a method of forming a semiconductor integrated circuit device which adopts a gate array scheme, the packaging efficiency of circuits can be enhanced, and a period of time for finishing up the product can be shortened.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A semiconductor integrated circuit device adopting a gate array scheme wherein circuits constructed of basic cells, which are arranged in a matrix array, are electrically connected by a plurality of layers of wiring, comprising:
   a semiconductor substrate having (1) basic cell forming regions, in which said basic cells are arranged in the matrix array, and (2) wiring channel regions, said wiring channel regions respectively being located between adjacent basic cell forming regions;
   first-layer wiring lines which are arranged at a position overlying said wiring channel regions;
   a first-layer inter-layer insulator film which is formed so as to cover said basic cells in said basic cell forming regions and said first-layer wiring lines overlying said wiring channel regions;
   second-layer wiring lines which are arranged at a position overlying said basic cell forming regions and overlying said wiring channel regions, and lying on said first-layer inter-layer insulator film, and which extend in a second direction different from a first extending direction, of said first-layer wiring lines, said wiring channel regions also extending in said first extending direction;
   a second-layer inter-layer insulating film which is formed so as to cover said first-layer inter-layer insulator film and said second-layer wiring lines; and
   third-layer wiring lines which are arranged at a position overlying said basic cell forming regions and overlying said wiring channel regions, and lying on said second-layer inter-layer insulator film, and which extend in a third direction, a wiring pitch of said third-layer wiring lines being substantially equal to or smaller than that of said first-layer wiring lines.

2. A semiconductor integrated circuit device according to claim 1, wherein said first-layer wiring lines, said second-layer wiring lines and said third-layer wiring lines are respectively used as signal wiring lines.

3. A semiconductor integrated circuit device according to claim 2, wherein each of said first-layer inter-layer insulator film and said second-layer inter-layer insulator film has recessed parts and flat parts, a depth of recesses at the recessed parts being at most 20% of a film thickness of the flat parts of said each film.

4. A semiconductor integrated circuit device according to claim 2, wherein each of the first-layer inter-layer insulator film and said second-layer inter-layer insulator film has recessed parts and flat parts, and wherein the recessed parts form an angle of at most 30° with the flat parts of said each film.

5. A semiconductor integrated circuit device according to claim 1, wherein said plurality of layers of wiring are at least three wiring layers.

6. A semiconductor integrated circuit device according to claim 1, wherein a ratio of said wiring pitch of said third-layer wiring lines to that of said first-layer wiring lines is set at one selected from the group consisting of 0.5 and 1.0.

7. A semiconductor integrated circuit device according to claim 1, wherein a projection of a midline of each third-layer wiring line coincides with a midline of a corresponding first-layer wiring line.

8. A semiconductor integrated circuit device according to claim 1, wherein a projection of a midline of at least one third-layer wiring layer does not coincide with a midline of a corresponding first-layer wiring line.

9. A semiconductor integrated circuit device according to claim 1, wherein said second direction is substantially perpendicular to the first extending direction, and said first extending direction and the third direction are substantially identical.

10. A semiconductor integrated circuit device according to claim 9, wherein a wiring pitch of said second-layer wiring lines is substantially equal to or smaller than that of said first-layer wiring lines.

11. A semiconductor integrated circuit device according to claim 10, wherein the wiring pitch of the second-layer wiring lines is smaller than that of said first-layer wiring lines.

12. A semiconductor integrated circuit device according to claim 1, wherein a projection of the second-layer wiring lines on the first-layer wiring lines intersects the first-layer wiring lines at lattice points, and the device further includes contact holes extending through the first-layer inter-layer insulator film at the lattice points, with electrically conductive material in the contact holes so as to provide electrical connection between the first-layer and second-layer wiring lines.

13. A semiconductor integrated circuit device according to claim 12, wherein said electrically conductive material is material of the second-layer wiring lines and formed simultaneously therewith.

14. A semiconductor integrated circuit device according to claim 12, wherein said electrically conductive material is a material filling up the contact hole.

15. A semiconductor integrated circuit device according to claim 1, wherein a width of the wiring channel regions, between adjacent basic cell forming regions, is at most about ¼ the width of each basic cell forming region, measured in the width direction of the wiring channel regions.

16. A semiconductor integrated circuit device according to claim 1, wherein the basic cell forming regions extend in said first extending direction.

17. A semiconductor integrated circuit device according to claim 16, wherein the first extending direction and the third direction are substantially the same.

18. A semiconductor integrated circuit device according to claim 1, wherein the first extending direction and the third direction are substantially the same.

19. A semiconductor integrated circuit device according to claim 1, wherein the first-layer wiring lines do not extend at a position overlying the basic cell forming regions.

20. A semiconductor integrated circuit device according to claim 1, wherein the first extending direction and the third direction are substantially the same, and wherein a midline of each of the third-layer wiring lines in a widthwise direction is shifted from a midline of each of the first-layer wiring lines in the widthwise direction.

21. A semiconductor integrated circuit device according to claim 1, wherein said each of the basic cells includes bipolar transistors, resistors and capacitors.

22. A semiconductor integrated circuit device according to claim 21, wherein said bipolar transistors have Selective Etching of Polysilicon Technology structure.

23. A semiconductor integrated circuit device according to claim 1, wherein the second-layer wiring lines and third-layer wiring lines overlie substantially the entire basic cell forming regions.

24. A semiconductor integrated circuit device adopting a gate array scheme wherein circuits constructed of basic cells, which are arranged in a matrix array, are electrically connected by a plurality of layers of wiring, comprising:

a semiconductor substrate having (1) basic cell forming regions, in which said basic cells are arranged in the matrix array, and (2) wiring channel regions, the wiring channel regions bering respectively located between adjacent basic cell forming regions;

first-layer wiring lines which are arranged at a position overlying said wiring channel regions;

a first-layer inter-layer insulator film which is formed so as to cover said basic cells in said basic cell forming regions and said first-layer wiring lines overlying said wiring channel regions;

second-layer wiring lines which are arranged at a position overlying said basic cell forming regions and overlying said wiring channel regions, and lying on said first-layer inter-layer insulator film and which extend in a second direction different from a first extending direction, of said first-layer wiring lines, a wiring pitch of said second-layer wiring lines being substantially equal to or smaller than that of said first-layer wiring lines, the wiring channel regions also extending in said first extending direction;

a second-layer inter-layer insulator film which is formed so as to cover said first-layer inter-layer insulator film and said second-layer wiring lines; and third-layer wiring lines which are arranged at a position overlying said basic cell forming regions and overlying said wiring channel regions, and lying on said second-layer inter-layer insulator film, and which extend in a third direction.

25. A semiconductor integrated circuit device according to claim 24, wherein said first-layer wiring lines, said second-layer wiring lines and said third-layer wiring lines are respectively used as signal wiring lines.

26. A semiconductor integrated circuit device according to claim 24, wherein said plurality of layers of wiring are at least three wiring layers.

27. A semiconductor integrated circuit device according to claim 24, wherein said second direction is substantially perpendicular to the first extending direction, and said first extending direction and the third direction are substantially identical.

28. A semiconductor integrated circuit device according to claim 24, wherein a projection of the second-layer wiring lines on the first-layer wiring lines intersects the first-layer wiring lines at lattice points, and the device further includes contact holes extending through the first-layer insulating layer at the lattice points, with electrically conductive material in the contact holes so as to provide electrical connection between the first-layer and second-layer wiring lines.

29. A semiconductor integrated circuit device according to claim 28, wherein a width of the wiring channel regions, between adjacent basic cell forming regions, is at most about ¼ the width of each basic cell forming regions, measured in the width direction of the wiring channel regions.

30. A semiconductor integrated circuit device according to claim 24, wherein the basic cell forming regions extend in said first extending direction.

31. A semiconductor integrated circuit device according to claim 30, wherein the first extending direction and the third direction are substantially the same.

32. A semiconductor integrated circuit device according to claim 24, wherein the first-layer wiring lines do not extend at a position overlying the basic cell forming regions.

33. A semiconductor integrated circuit device according to claim 24, wherein said each of the basic cells includes bipolar transistors, resistors and capacitors.

34. A semiconductor integrated circuit device according to claim 33, wherein said bipolar transistors have Selective Etching of Polysilicon Technology structure.

35. A semiconductor integrated circuit device according to claim 24, wherein the second-layer wiring lines and third-layer wiring lines overlie substantially the entire basic cell forming regions.

36. A semiconductor integrated circuit device adopting a gate array scheme wherein circuits constructed of basic cells, which are arranged in a matrix array, are electrically connected by a plurality of layers of wiring, comprising:

a semiconductor substrate having (1) basic cell forming regions, in which said basic cells arranged in the matrix array are formed, and (2) wiring channel regions, the wiring channel regions being respectively located between adjacent basic cell forming regions;

first-layer wiring lines which are arranged at a position overlying said wiring channel regions;

a first-layer inter-layer insulator film which is formed so as to cover said basic cells in said basic cell forming regions and said first-layer wiring lines overlying said wiring channel regions;

second-layer wiring lines which are arranged at a position overlying said basic cell forming regions and overlying said wiring channel regions, and lying on said first-layer inter-layer insulator film, and which extend in a second direction different from a first extending direction, of said first-layer wiring lines, the wiring channel regions also extending in said first extending direction;

a second-layer inter-layer insulator film which is formed so as to cover said first-layer inter-layer insulator film and said second-layer wiring lines; and third-layer wiring lines which are arranged at a position overlying said basic cell forming regions and overlying said wiring channel regions, and lying on said second-layer inter-layer insulator films, and which extend in a third direction, each of a wiring pitch of said third-layer wiring lines and that of said second-layer wiring lines being substantially equal to a wiring pitch of said first-layer wiring lines.

37. A semiconductor integrated circuit device according to claim 36, wherein said first-layer wiring lines, said second-layer wiring lines and said third-layer wiring lines are respectively used as signal wiring lines.

38. A semiconductor integrated circuit device according to claim 36, wherein said plurality of layers of wiring are at least three wiring layers.

39. A semiconductor integrated circuit device according to claim 36, wherein said second direction is substantially perpendicular to the first extending direction, and said first extending direction and the third direction are substantially identical.

40. A semiconductor integrated circuit device according to claim 39, wherein a wiring pitch of said third-layer wiring lines is substantially equal to that of said first-layer wiring lines.

41. A semiconductor integrated circuit device according to claim 36, wherein a projection of the second-layer wiring lines on the first-layer wiring lines intersects the first-layer wiring lines at lattice points, and the device further includes contact holes extending through the first-layer insulating layer at the lattice points, with electrically conductive material in the contact holes so as to provide electrical connection between the first-layer and second-layer wiring lines.

42. A semiconductor integrated circuit device according to claim 36, wherein a width of the wiring channel regions, between adjacent basic cell forming regions, is at most about ¼ the width of each basic cell forming region, measured in the width direction of the wiring channel regions.

43. A semiconductor integrated circuit device according to claim 36, wherein the basic cell forming regions extend in said first extending direction.

44. A semiconductor integrated circuit device according to claim 43, wherein the first extending direction and the third direction are substantially the same.

45. A semiconductor integrated circuit device according to claim 36, wherein the first-layer wiring lines do not extend at a position overlying the basic cell forming regions.

46. A semiconductor integrated circuit device adopting a gate array scheme wherein circuits constructed of basic cells, which are arranged in a matrix array, are electrically connected by a plurality of layers of wiring, comprising:

a semiconductor substrate having (1) basic cell forming regions, in which said basic cells are arranged in the matrix array, and (2) wiring channel regions, the wiring channel regions being respectively located between adjacent basic cell forming regions;

first-layer wiring lines which are arranged at a position overlying said wiring channel regions;

a first-layer inter-layer insulator film which is formed so as to cover said basic cells in said basic cell forming regions and said first-layer wiring lines overlying said wiring channel regions;

second-layer wiring lines which are arranged at a position overlying said basic cell forming regions and overlying said wiring channel regions, and lying on said first-layer inter-layer insulator film, and which extend in a second direction different from a first extending direction, of said first-layer wiring lines, said wiring channel regions also extending in said first extending direction;

a second-layer inter-layer insulator film which is formed so as to cover said first-layer inter-layer insulator film and said second-layer wiring lines; and third-layer wiring lines which are arranged at a position overlying said basic cell forming regions and overlying said wiring channel regions, and lying on said second layer inter-layer insulator film, and which extend in a third direction, a ratio of wiring pitch of said third-layer wiring lines to that of said first-layer wiring lines being set at one selected from the group consisting of 0.5, 1.0, 1.5 and 2.0.

47. A semiconductor integrated circuit device according to claim 46, wherein the basic cell forming regions extend in said first extending direction.

48. A semiconductor integrated circuit device according to claim 47, wherein the first extending direction and the third direction are substantially the same.

49. A semiconductor integrated circuit device according to claim 46, wherein the first-layer wiring lines do not extend at a position overlying the basic cell forming regions.

50. A semiconductor integrated circuit device according to claim 49, wherein a wiring pitch of said second-layer wiring lines is substantially equal to or smaller than that of said first-layer wiring lines, and said second direction is substantially perpendicular to said first extending direction.

51. A semiconductor integrated circuit device according to claim 50, wherein the wiring pitch of the second-layer wiring lines is smaller than that of said first-layer wiring lines.

* * * * *